US006372103B1

(12) United States Patent
Perry et al.

(10) Patent No.: US 6,372,103 B1
(45) Date of Patent: Apr. 16, 2002

(54) ULTRASHORT PULSE LASER DEPOSITION OF THIN FILMS

(75) Inventors: Michael D. Perry; Paul S. Banks, both of Livermore; Brent C. Stuart, Fremont, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/568,617

(22) Filed: May 10, 2000

Related U.S. Application Data (62) Division of application No. 09/316,970, filed on May 24, 1999, now abandoned.
(60) Provisional application No. 60/103,864, filed on Oct. 12, 1998.

(51) Int. Cl.$^7$ .............................................. C23C 14/34
(52) U.S. Cl. ........................... 204/298.02; 204/298.03; 204/192.11; 378/120
(58) Field of Search ....................... 204/298.02, 298.03, 204/192.11; 378/170

(56) References Cited

U.S. PATENT DOCUMENTS

| | | | |
|---|---|---|---|
| 5,064,520 A | * 11/1991 | Miyake et al. | 204/192.11 |
| 5,175,757 A | * 12/1992 | Augustoni et al. | 378/120 |
| 5,490,912 A | * 2/1996 | Warner et al. | 204/298.02 |
| 5,989,397 A | * 11/1999 | Laube et al. | 204/298.03 |
| 6,024,851 A | * 2/2000 | Radhakrishnan | 204/298.02 |

OTHER PUBLICATIONS

A. Klehr et al, "Control of light polarization in InGaAsP/InP lasers by injection of light pulses", J. Appl.Phys. 81(5), Mar. 1, 1997, pp. 2064–2069.*
J. R. Davies et al, "Short–pulse high–intensity laser–generated fast electron transport into thick solid targets", The American Physical Society, 56(6), pp. 7193–7203.*
P. Tosin et al, "Laser–induced surface structures on diamond films", J. Appl.Phys., 78(6), pp. 3797–3800.*

* cited by examiner

Primary Examiner—Gregory Mills
Assistant Examiner—Rudy Zervigon
(74) Attorney, Agent, or Firm—John P. Wooldridge; Alan H. Thompson (57) ABSTRACT

Short pulse PLD is a viable technique of producing high quality films with properties very close to that of crystalline diamond. The plasma generated using femtosecond lasers is composed of single atom ions with no clusters producing films with high $Sp^3/Sp^2$ ratios. Using a high average power femtosecond laser system, the present invention dramatically increases deposition rates to up to 25 $\mu$m/hr (which exceeds many CVD processes) while growing particulate-free films. In the present invention, deposition rates is a function of laser wavelength, laser fluence, laser spot size, and target/substrate separation. The relevant laser parameters are shown to ensure particulate-free growth, and characterizations of the films grown are made using several diagnostic techniques including electron energy loss spectroscopy (EELS) and Raman spectroscopy.

17 Claims, 11 Drawing Sheets

FIG. 13A DIAMOND

FIG. 13B AMORPHOUS DIAMOND

FIG. 13C GRAPHITE

FIG. 13D AMORPHOUS CARBON

ULTRASHORT PULSE LASER DEPOSITION OF THIN FILMS

CROSS REFERENCE TO RELATED APPLICATIONS

This application is a divisional of 09/316,970 filed May 24, 1999 abandoned.

This application claims priority in provisional application filed on Oct. 12, 1998, entitled "Ultrashort Pulse Laser Deposition of Thin Films," Ser. No. 60/103,864, by Paul S. Banks, Michael D. Perry, and Brent C. Stuart.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the production of diamond-like carbon films, and more specifically, it relates to the use of short-pulse lasers to produce amorphous films of diamond-like carbon with properties typical of PLD-produced DLC at deposition rates much higher than even many CVD methods.

2. Description of Related Art

The use of diamond thin films has the potential for major impact in many industrial and scientific applications. These include heat sinks for electronics, broadband optical sensors, windows, cutting tools, optical coatings, laser diodes, cold cathodes, and field emission displays. Attractive properties of natural diamond consist of physical hardness, high tensile yield strength, chemical inertness, low coefficient of friction, high thermal conductivity, and low electrical conductivity. Unfortunately, these properties are not completely realized in currently produced diamond thin films.

Chemical vapor deposition, in its many forms, has been the most successful to this point in producing crystalline diamond films microns to millimeters in thickness which are made up of closely packed diamond crystals microns in physical dimension. However, high purity films are difficult to realize due to the use of hydrogen in the growth process which becomes included in the film matrix. These impurities are manifest in film physical properties which are inferior to those of pure crystalline diamond. In addition, the large density of grain boundaries due to the polycrystalline nature of the films reduce the films diamond-like character. Finally, substrates must be heated to several hundred degrees Celsius, which is not suitable for many materials.

Pulsed laser deposition(PLD) is attractive due to its ability to produce high purity films—limited only by the purity of the target. For diamond film production, high purity carbon can be ablated directly by lasers and deposited as thin films at ambient temperatures. However, lasers currently in use generally deliver long (>10 ns) pulses, and the generally explosive nature of laser ablation, in addition to the desired single-atom or single-ion carbon, liberates significant amounts of carbon clusters ($C_n$ where n=2–30) and macroscopic particles (>1–10 $\mu$m) of carbon. These carbon particles interrupt the ordered deposition of crystalline diamond, forming undesirable grain boundaries and rough surfaces that are difficult to polish. In addition, PLD generated films tend to be "amorphous" or nanocrystalline with no observable long-range order, but still possessing physical properties which are diamond-like in some approximation. This has given rise to the term "diamond-like carbon" (DLC)when referring to these PLD-produced, amorphous carbon films. Growth rates for PLD have been prohibitively slow until recently with the advent of high average power, high rep-rate lasers.

SUMMARY OF THE INVENTION

It is an object of the present invention to provide techniques for production of high quality films with properties very dose to that of crystalline diamond.

There has been evidence that increasing laser intensity, and thus particle kinetics, leads to DLC film which are increasingly more diamond-like in character. Given that short pulse (100 picoseconds or less) lasers can reach intensities much higher than those achievable with conventional lasers, combined with the fact that laser ablation using short pulses is relatively gentle, short pulse PLD is a viable technique of producing high quality films with properties very dose to that of crystalline diamond. The plasma generated using femtosecond lasers is composed of single atom ions with no clusters producing films with high $sp^3/sp^2$ ratios. Using a high average power femtosecond laser system, the present invention dramatically increases deposition rates to up to 25 $\mu$m/hr (which exceeds many CVD processes) while growing particulate-free films. In the present invention, deposition rates is a function of laser wavelength, laser fluence, laser spot size, and target/substrate separation. The relevant laser parameters are shown to ensure particulate-free growth, and characterizations of the films grown are made using several diagnostic techniques including electron energy loss spectroscopy (EELS) and Raman spectroscopy. The nonthermal processes involved in femtosecond laser ablation prove ideal for laser machining of high explosives, and some pellets of explosive materials have been successfully cut.

DETAILED DESCRIPTION OF THE INVENTION

Figure 1:
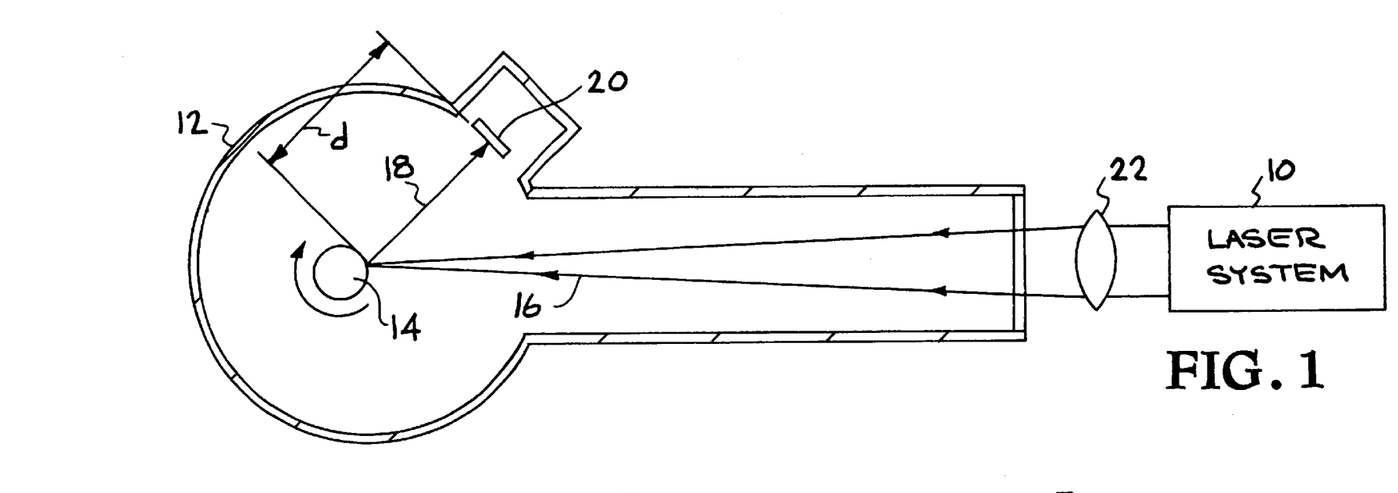
FIG. 1 shows a cross section of a deposition chamber used in the present invention.

Referring to FIG. 1, the laser system used for ablating the graphite target used for the experiments is a 3–4 W average power, 120 fs laser system 10. It is a chirped-pulse-amplification system that uses a Ti:sapphire regenerative amplifier operating at 1 kHz repetition rate, thus providing a millijoule-level pulse every millisecond. The experiments were conducted in a vacuum chamber 12 (a 6" diameter sphere) at a base pressure of 0.5–5 $\mu$torr. A 1" diameter graphite rod 14 was rotated about it's longitudinal axis (perpendicular to the laser beam 16) while the beam 16 impinged on the rod 14 at a 45° angle of incidence. The resulting plasma plume 18 was directed as well as possible toward the substrate 20 which was held in place by an aluminum annulus (not shown) with a 12 mm inside diameter and a 25 mm outside diameter. The rod could also be translated along it's long axis at 400 $\mu$m/s so that the laser pulse was incident on a nominally flat surface. The distance from the graphite surface to the substrate surface (denoted by d in FIG. 1) was varied from 31 mm to 85 mm by moving the substrate assembly in or out. A 45 cm focal length, plano-convex lens 22 was used to control the spot size on the target surface with the beam waist located behind the ablation surface.

The laser beam 16 was nearly diffraction-limited, and the spot size on the graphite surface 14 was determined by calculating the ideal gaussian spot size at a distance x from the waist position. The waist position was determined by reducing the fluence incident on the target and moving the lens to maximize the brightness of the plasma observed. The spot size on the target was then adjusted by moving the lens 22 closer to the target by the appropriate amount. The energy incident on the target was also varied, as was the incident polarization (s and p linear polarizations as well as circularly polarized).

The films were grown on single crystal silicon wafers which had been cleaved into 15 mm squares as well as on polished fused quartz substrates. Substrate preparation usually consisted of cleaning with methanol or acetone although the effect of etching with HF acid was investigated. It was also possible to electrically bias the substrate assembly and, using a current probe, measure the current due to the plasma striking the substrate. After growth, the film thicknesses were measured, deposition rates determined, and electron energy loss spectroscopy (EELS), Raman spectroscopy, optical transmission, spectral ellipsometry, UV photoelectron spectroscopy, and Auger spectroscopy were used to determine how "diamond-like" the films were. Scanning electron microscopy and atomic force microscopy were also used to examine the surface morphology.

Figure 2:
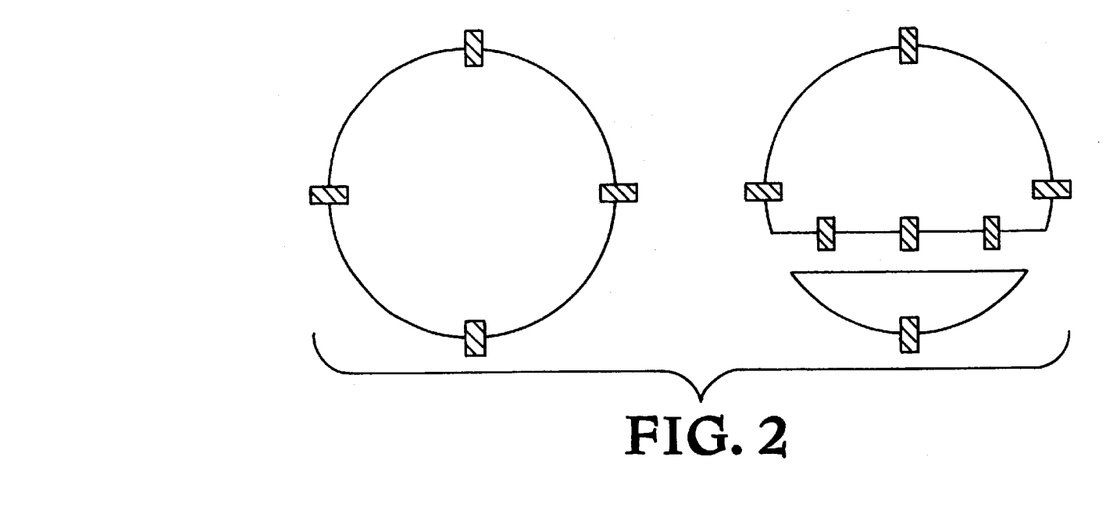
FIG. 2 shows the positions on the substrate where film thickness was measured.

Films of thickness ranging from 20 nm to 18 $\mu$m were grown in this fashion for incident fluences varying from 0.1 J/cm$^2$ to 30 J/cm$^2$ and spot sizes from 50 $\mu$m to 600 $\mu$m. The film thickness was measured using a Tencor P-10 surface profiler along the outside circumference of the films. Many of the films were also grown with a mask (a 3 mm wide strip of stainless steel) positioned 3 mm above the substrate surface, allowing the step height to be measured along the resulting edge and determination of any thickness variation across the film (see FIG. 2). It was found that the substrate diameter was too small for there to be any pronounced variation in film thickness across the sample. The only instances where thickness variations were observed were where the center of the plasma plume was not directed at the center of the substrate. This resulted in a monotonically increasing thickness across the sample in some direction. This also indicates that the plume and resulting film are quite sharply peaked.

Figure 3:
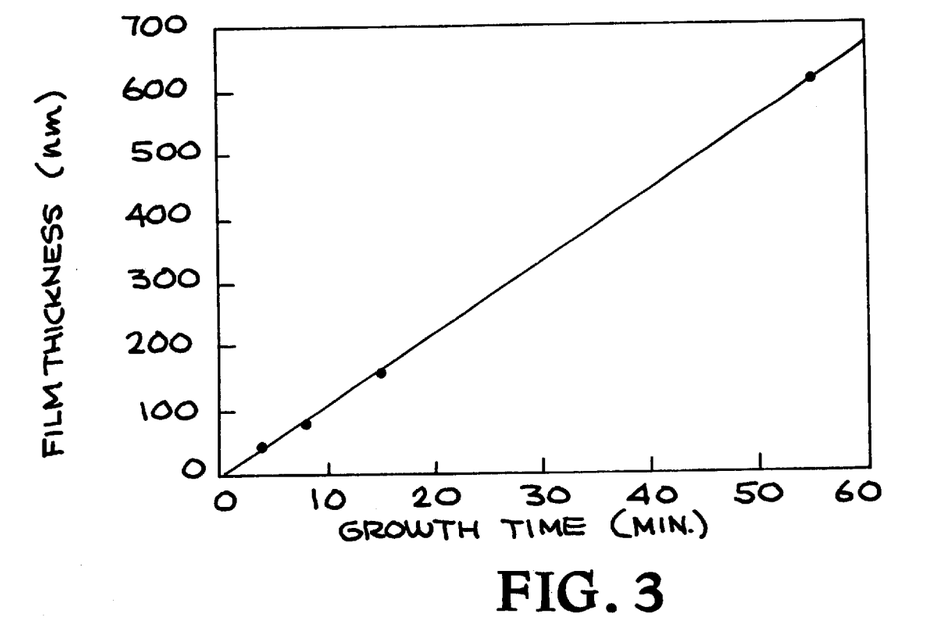
FIG. 3 shows growth rate as a function of time.

By growing films under several different conditions and measuring the resultant film thickness, it was possible to establish the effect of these parameters. The rate was determined by dividing the maximum thickness measured by the elapsed time for the growth process. To verify that the growth rate did not change with thickness, several films were grown under the same conditions for several different times as shown in FIG. 3. Thus, the rates obtained should be valid, independent of film thickness or growth time.

Figure 4:
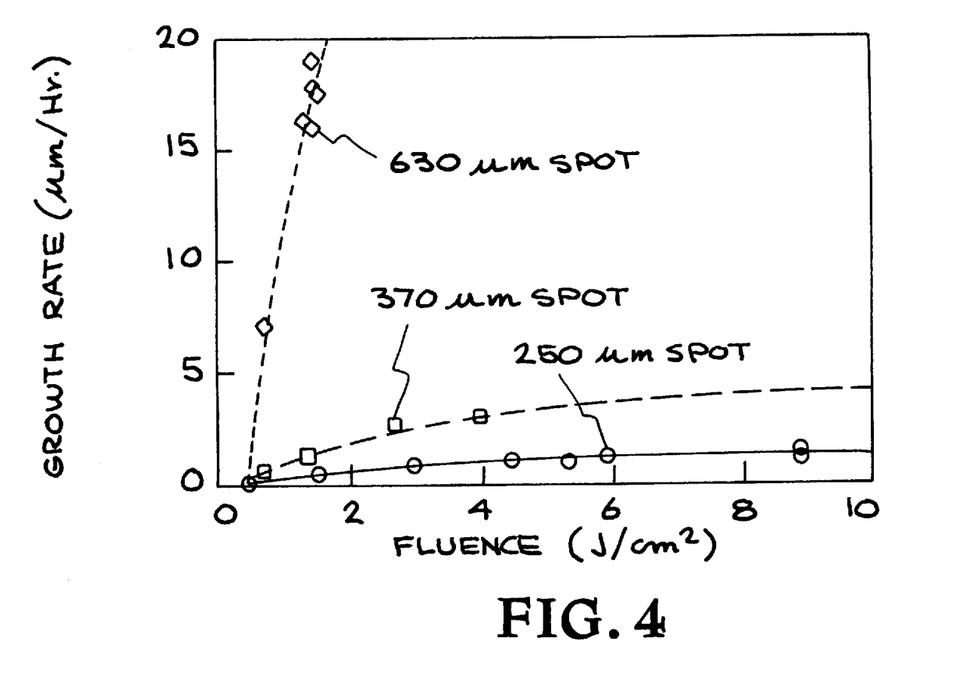
FIG. 4 shows growth rate as a function of incident laser fluence.
Figure 5:
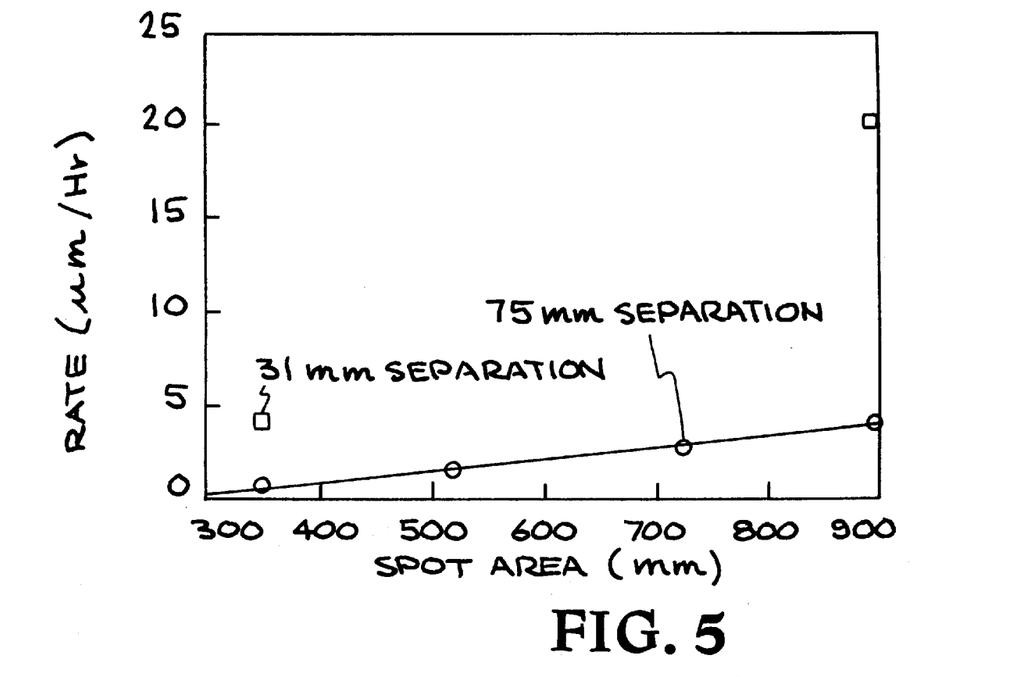
FIG. 5 shows growth rate as a function of area of laser spot size.
Figure 6:
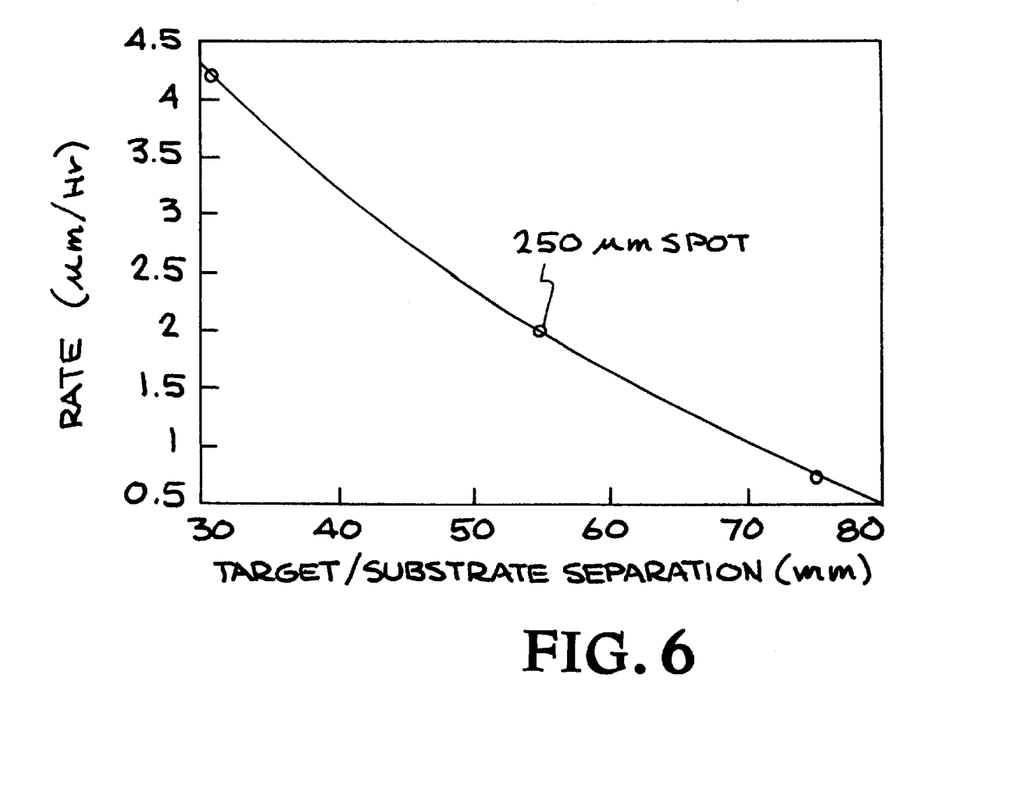
FIG. 6 shows film growth rate as a function of separation distance between target and substrate for 1.4 J/cm$^2$ and 250 mm spot.

Rates were measured as a function of laser fluence on the graphite target, laser spot size on the target surface, and the distance between the target and substrate surfaces, and the results are shown in FIGS. 4–6. In FIG. 4, the dots are for a 250 $\mu$m spot with a 75 mm target/substrate separation, the squares are for a 370 $\mu$m spot and 75 mm separation, and the diamonds are for a 630 $\mu$m spot and a 31 mm separation. The line is a logarithmic fit to the data. As seen in FIG. 4, the growth rate saturates quickly at laser fluences above a few J/cm$^2$. There is, however, an indication of how significant the target/substrate separation and spot size is to increasing growth rates. Higher fluences for the larger spot sizes were not possible due to laser power limitations. In FIG. 5, the dots are for 75 mm target/substrate separation and the squares are for 31 mm separation. The line is a linear fit of the data. FIG. 5 shows a linear relationship between growth rate and the area of the material removal region (as determined by the laser spot size) for a given fluence (1.4 J/cm$^2$). As discussed previously, this is because the larger transverse dimensions of the initial plasma results in slower transverse expansion and a higher flux incident on the substrate. This increase in flux is also the reason that reducing the distance between the target and substrate results in dramatically larger growth rates. This is where sub-picosecond lasers have a large advantage over conventional PLD. Since the initial plasma is ideally composed of single atom ions, there are no macroparticulates present which will contaminate the film as it grows. It is no longer necessary to maintain large separations or use buffer gases to reduce the impact of these macroparticles. In FIG. 6, film growth rate is shown as a function of separation distance between target and substrate for 1.4 J/cm$^2$ and 250 $\mu$m spot. The line is a logarithmic fit to the data.

In addition to these experimental conditions, the substrate material had a significant effect on the growth rate of the films. Both crystalline silicon and fused quartz substrates were used, and the rates for films grown on the quartz substrates were approximately 20–30% higher than those grown on the silicon. This held true for films from 50 nm thick to films over a micron thick. Perhaps the amorphous structure of the quartz is more closely matched to that of the DLC films than the silicon, although there were no observable differences in the film properties. The effects of surface preparation on the growth of DLC films was also investigated. The surface of the silicon was etched with 1%–10% HF acid for 1 to 60 minutes, and then the substrates were stored in a nitrogen atmosphere until use. No change in growth rates or film morphology was observed when compared with those of films grown on silicon that had only been cleaned with acetone or methanol.

Finally, a small dependence of deposition rate on the polarization of the incident laser light was observed. The use of S-polarized light resulted in a growth rate approximately 20% lower than that achieved when using P-polarized or circularly polarized light. This is likely due to less of the laser energy being absorbed by the graphite because of a higher fresnel reflectivity for S-polarization. Macroparticulates, apparently from the target, were also seen when using S-polarized light. Also, the rate achieved using the second harmonic (413 nm) was only one fifth that realized using the fundamental.

Figure 7:
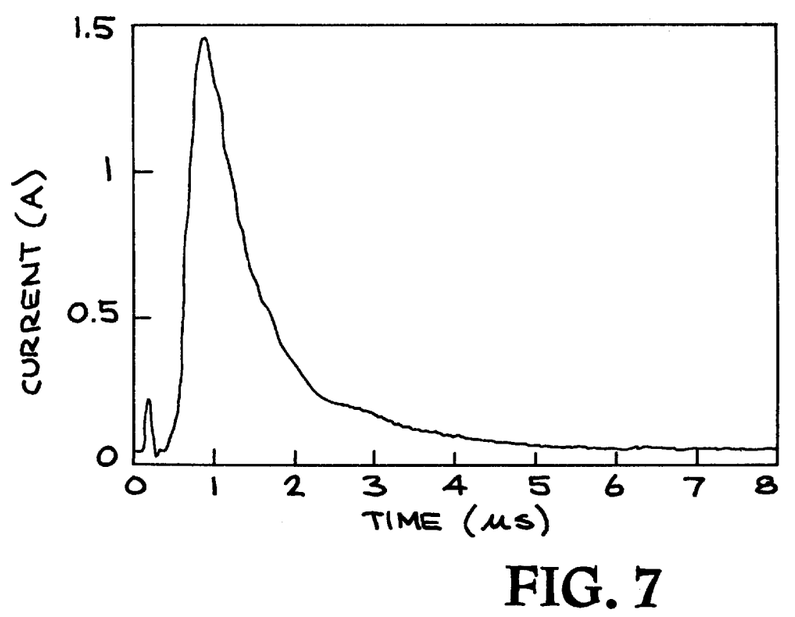
FIG. 7 shows current measured for 25 J/ cm$^2$, 150 mm spot at 75 mm separation.

The substrate was biased to −300 V, and a current probe was used to measure the current due to the plasma reaching the substrate. This measurement allows an estimate of the percentage of the plasma which is charged as well as the determination of the velocity distribution. FIG. 7 shows the current pulse measured for 25 J/cm$^2$, 150 µm spot and 75 mm target/substrate separation. The laser pulse was incident on target at t=0.0 µs. The small peak at 200 ns is electrical noise from the firing of the pulsed bias supply. Integrating to find the area under the curve gives 1.5 µC of charge delivered to the substrate during the pulse. The film grown under these conditions is 44 nm thick (uniformly) after 6:00 minutes. The substrate and holder have an area of 8 cm$^2$ so if a uniform thickness is assumed across this region, the volume of material delivered in this time is 3.5×10$^{-5}$ cm$^3$ (assuming 100% of material sticks and is incorporated in the film). The typical density of graphite or diamond is 2–3 g/cm$^3$ so 3 g/cm$^3$ will give an overestimate. Using this latter value gives 0.106 mg and therefore 5.3×10$^{18}$ C atoms delivered to the substrate and holder in 6:00 minutes. The total charge would be 1.5 µC times 360,000 pulses or 0.54 C which corresponds to 3.38×10$^{38}$ charge quanta. If it is assumed that each ion is singly ionized, this estimate indicates that ions make up approximately 65% of the plasma when it reaches the substrate 75 mm from the target surface.

This is much higher than anything reported for the use of long pulse PLD where a few percent is good. However, there are many unknowns in this calculation, most importantly the fraction of particles in the plasma which stick to the substrate at first impact and are not reflected elsewhere in the chamber. It is possible that the majority of particles delivered are not captured, particularly with the high kinetic energies that these particles have (as will be described next). It should also be noted that at lower laser fluences (e.g., 2 J/cm$^2$), the ion fraction becomes a fraction of a percent. It does not, however, vary significantly between 38 mm and 75 mm from the target. This would indicate that there is not much recombination occurring after that point.

FIG. 7 also gives the velocity distribution for the plasma incident on the substrate. Assuming that the velocity of the plasma expansion quickly approaches an asymptotic value within a few hundred microns, the target/substrate separation divided by the time delay from laser pulse to current signal will give the velocity at which the particles are traveling. The value of the velocity of the peak of the distribution is plotted as a function of laser fluence in FIG. 8. It is apparent that the most probable velocity is independent of spot size or separation so that the particles have reached their asymptotic velocity well before 38 mm. Carbon ions traveling at speeds of 40 to 80 km/s correspond to kinetic energies of 100 to 400 eV.

It is also apparent that using 413 nm light rather than 825 nm light more than doubles the velocity. The only possible explanations thus far are first, the skin depth for 2ω light is smaller resulting in a smaller ablation depth although the exact relationship between skin depth and ablation depth is unknown and second, the graphite target has higher absorption at 2ω. Let the refractive index $n_0$ be defined as $n_0$=n+k, and for graphite (ordinary polarized light), n=3.1 for 825 nm and 2.6 for 413 nm and k=1.9 for 825 nm light and 1.3 for 413 nm. The skin depth is defined by δ=nλ/(2πk) and is 200 nm for 825 nm light and 130 nm for 413 nm light. The fact that the deposition rate at 413 nm is much lower may also indicate that the ablation depth at this wavelength is significantly smaller than at 825 nm.

The complex reflection coefficients for a conducting medium are $$r_s = \frac{\cos\theta_1 - (n+k)\cos\theta_2}{\cos\theta_1 + (n+k)\cos\theta_2} \text{ and} \quad (1)$$

$$r_p = \frac{(n+k)\cos\theta_1 - \cos\theta_2}{(n+k)\cos\theta_1 + \cos\theta_2} \quad (2)$$

$$\text{where } \cos\theta_2 = \sqrt{1 - \frac{\sin^2\theta_1}{(n+k)^2}} \quad (3)$$

and $\theta_1$ is the angle of incidence (45° in this case). For 825 nm light, $|r_p|^2$=0.27 and $|r_s|^2$=0.52 while for 413 nm light, $|r_p|^2$=0.17 and $|r_s|^2$=0.42. This makes the absorptance (1−|r|$^2$) for graphite at 413 nm approximately 15–20% larger than for 825 nm.

Figure 8:
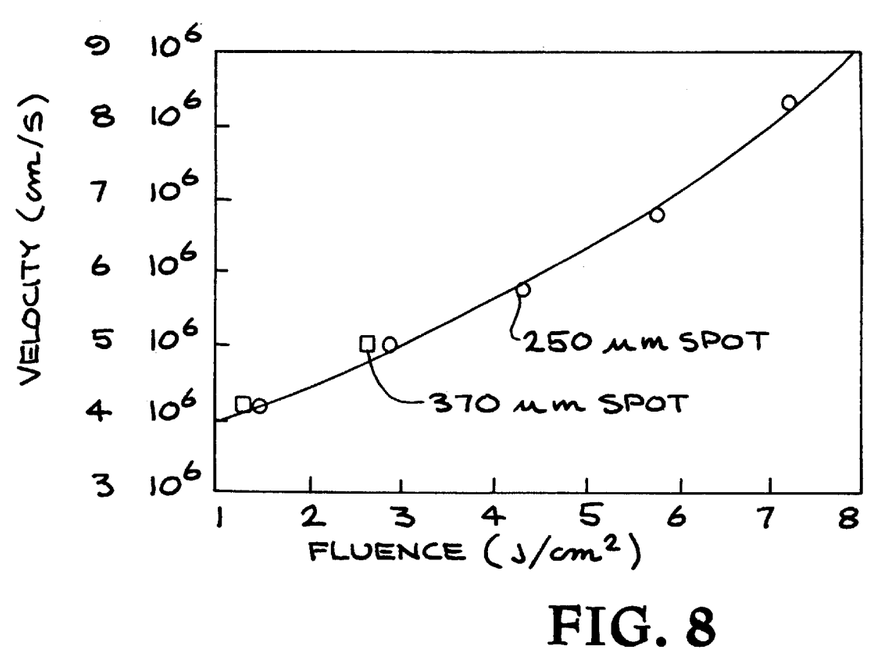
FIG. 8 shows velocity of peak of current pulse as a function of laser fluence.

FIG. 8 shows the velocity of peak of current pulse as a function of laser fluence. The dots are for a 250 µm spot at 75 mm separation, the squares are for a 370 µm spot at 75 mm separation, the diamonds are for a 370 µm spot at 38 mm separation, and the x is for a 250 µm spot at 31 mm separation with 413 nm light. The line is an exponential fit to the data.

The physical morphology of each film was also examined using both optical and electron microscopy and atomic force microscopy (AFM). The chemical composition of the films were examined using electron energy loss spectroscopy (EELS), Raman spectroscopy, optical transmission measurements, ellipsometry, Auger spectroscopy, and UV photoelectron spectroscopy (UPS). Particularly with the chemical analysis, a comparison was made with the properties expected for crystalline diamond, graphite, or the typical amorphous carbon films made using CVD and PLD.

Figure 9:
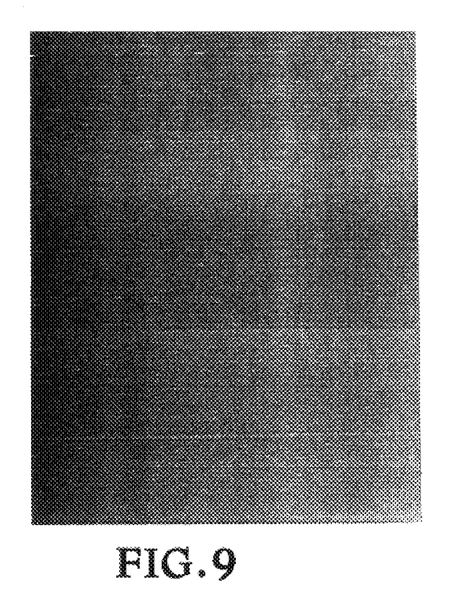
FIG. 9 shows optical photomicrograph of DLC film.
Figure 10A:
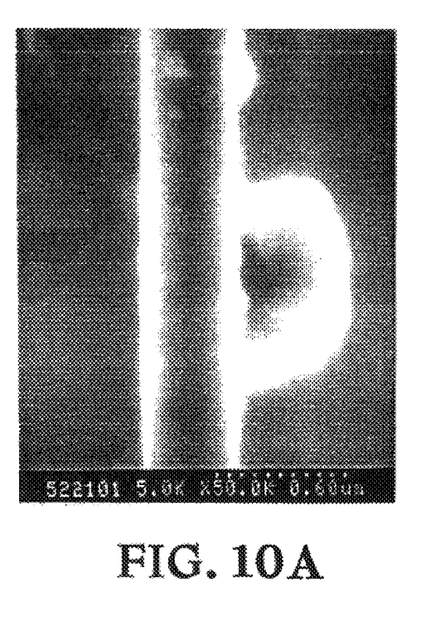
FIGS. 10A and B show electron photomicrographs of a cross section of DLC film.
Figure 10B:
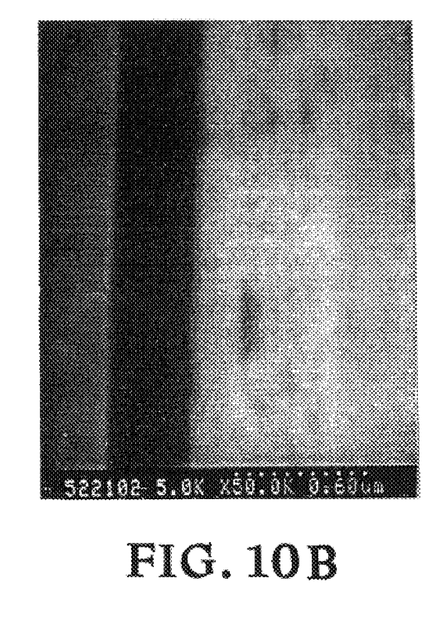

Using femtosecond pulses, films were produced which are free of graphite particulates which have characterized PLD growth of DLC films. FIG. 9 is an optical photomicrograph of a 250 nm thick DLC film which has almost no visible graphite particulates. There is also no observable structure on the surface or when cross sectioned. FIGS. 10A and 10B show views of the cross section of a film. Of particular interest is the large particle in FIG. 10A, which must have been a small piece of dirt present on the substrate before coating. The film appears to be uniform around the particle, even on the side walls. As mentioned before, the use of P-polarized or circularly polarized light is useful for the prevention of the presence of particulates in the films.

Figure 11:
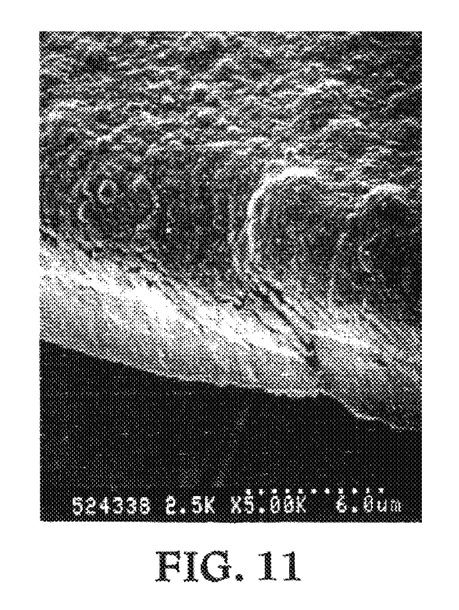
FIG. 11 shows electron photomicrograph of 18 mm thick DLC film.

However, as the films grows thicker (>500 nm), a cauliflower-like surface texture begins to form which becomes more pronounced as the film grows. This can be seen in FIG. 11 which is the edge of a film which is 20 µm thick. Films thicker than 3–5 µm showed a tendency to lift-off the substrate with quartz being more susceptible to this. There was also a tendency for the films to crack and shatter due to internal stresses. This is typical of PLD-produced films, but occurs at much smaller thicknesses (less than 1 µm) for long-pulse PLD. As shown in FIG. 11, intact films up to 20 µm were grown (although there was some cracking and lift-off in certain regions), and free standing films which had lifted off were produced with areas of 10–20 mm² and larger.

Atomic force microscopy was used to measure the surface roughness of three films:

| Film | Thickness (nm) | Growth rate (µm/hr) | RMS roughness (nm) |
|---|---|---|---|
| 1 | 20 | .35 | .5 |
| 2 | 30 | .55 | 1 |
| 3 | 210 | 1.2 | 1.5 |

Figure 12:
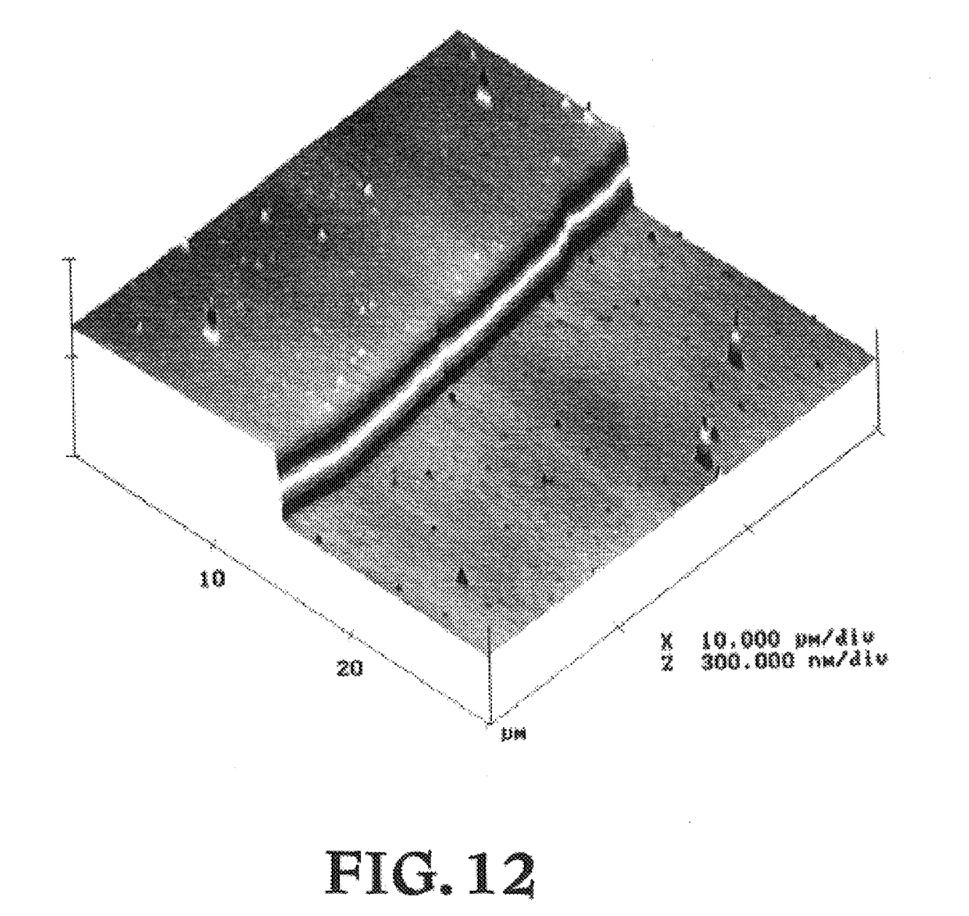
FIG. 12 shows an AFM scan of edge of 200 nm thick DLC film.
Figure 13A:
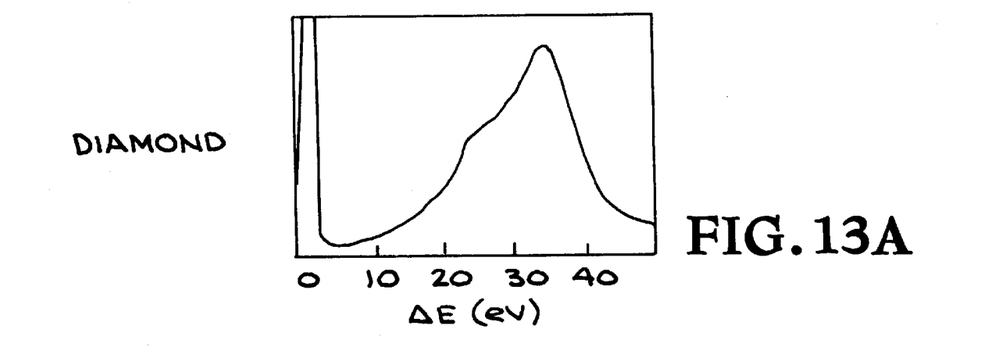
FIGS. 13A–D show EELS signatures for various phases of carbon films.
Figure 13B:
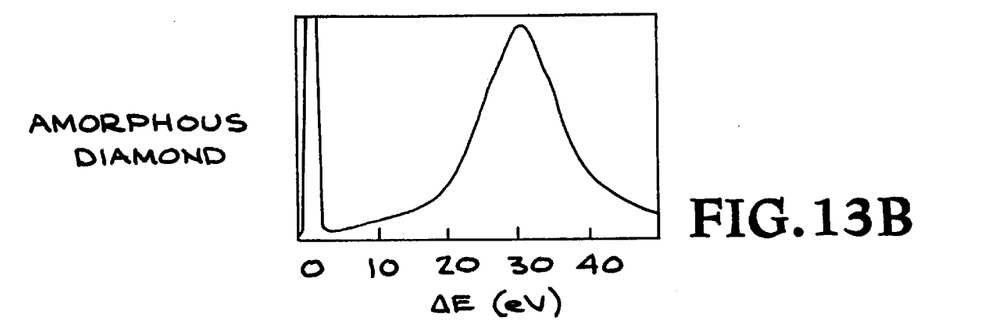
Figure 13C:
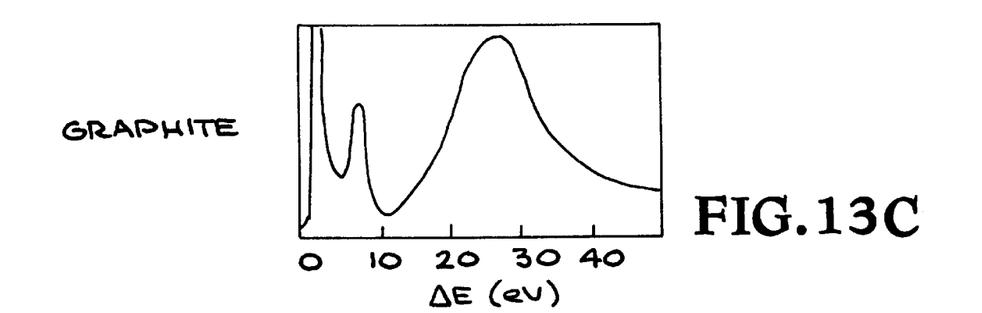
Figure 13D:
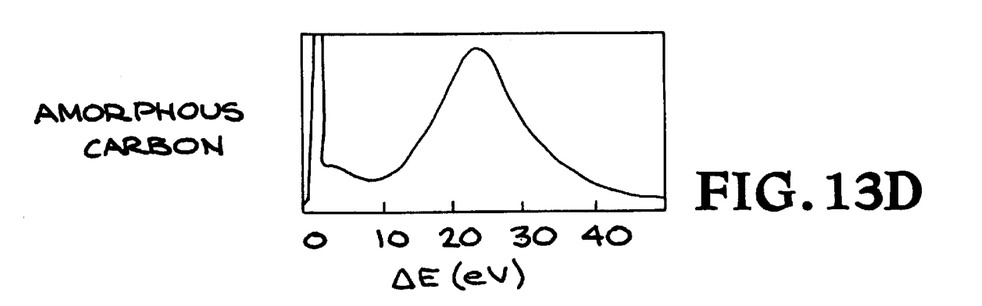

FIG. 12 shows the results of this type of scan where the edge of the film is shown with the uncoated Si surface on the right. It is apparent that the presence of small bumps in the deposited film is due to the presence of contaminants on the original silicon surface (which had been masked). The density and size were approximately the same for the film surface and for the silicon surface. Similar measurements done using the profilometer showed that the RMS surface roughness of a film was typically on the order of 1% of the film thickness. As discussed earlier, the ease with which the films conform to the surface would indicate that to first order, they would be as smooth as the substrate surface they are grown on. The development of the surface texture is most likely due to the growth in the size of the nanocrystals and a high defect concentration.

In order to determine the chemical structure of the films produced, EELS and Raman spectroscopy are two popular techniques to determine the amount of diamond-like $sp^3$ bonds present in the film. EELS looks at the inelastic scattering of high energy electrons by plasmons with the shift in energy being indicative of the type of bond present. FIGS. 13A–D show some characteristic EELS signatures of crystalline diamond, amorphous diamond, graphite, and amorphous carbon (both diamond-like and graphitic) films respectively. The $sp^2$ bond of graphite shows up as a peak at about 5 eV as seen in the lower two curves. Fallon and Brown, for CVD produced films, have correlated the amount that the large peak is shifted to the fraction of the material which is $sp^3$ bonded.

Figure 14:
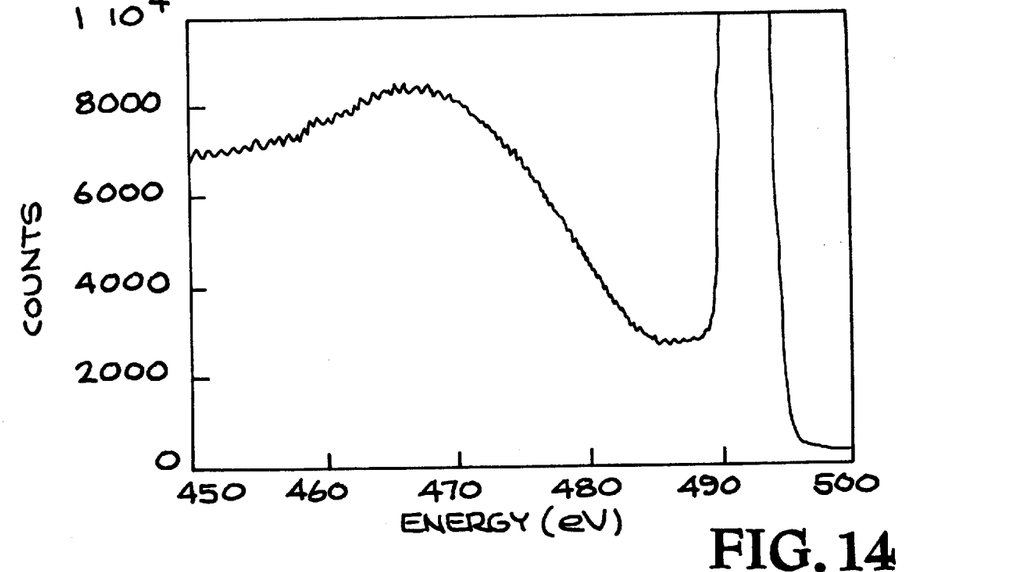
FIG. 14 shows an EELS spectrum of DLC film.

EELS measurements of femtosecond PLD-produced films show no graphitic content (see FIG. 14) with plasmon shifts of 21 eV to 26 eV.

| Film | Plasmon shift (eV) | Fluence (J/cm²) | Film thickness (nm) | polarization | rate (µm/hr) |
|---|---|---|---|---|---|
| 1 | 26 | .4 | 420 | s | .21 |
| 2 | 23 | 12 | 710 | s | 1.4 |
| 3 | 22 | 12 | 570 | s | 1.2 |
| 4 | 25 | 4 | 470 | s | 9 |
| 5 | 20 | 8 | 200 | c | 1.2 |
| 6 | 21 | 2 | 18000 | c | 9 |
| 7 | 21 | 1.7 | 330 | p | .6 |

The last line is for 413 nm light. It would appear that s-polarization or lower fluences produce films with a larger plasmon shift, indicating a higher $sp^3$ content. This trend is contradicted, as will be discussed later, by the films produced at higher fluences becoming more optically transparent.

Figure 15:
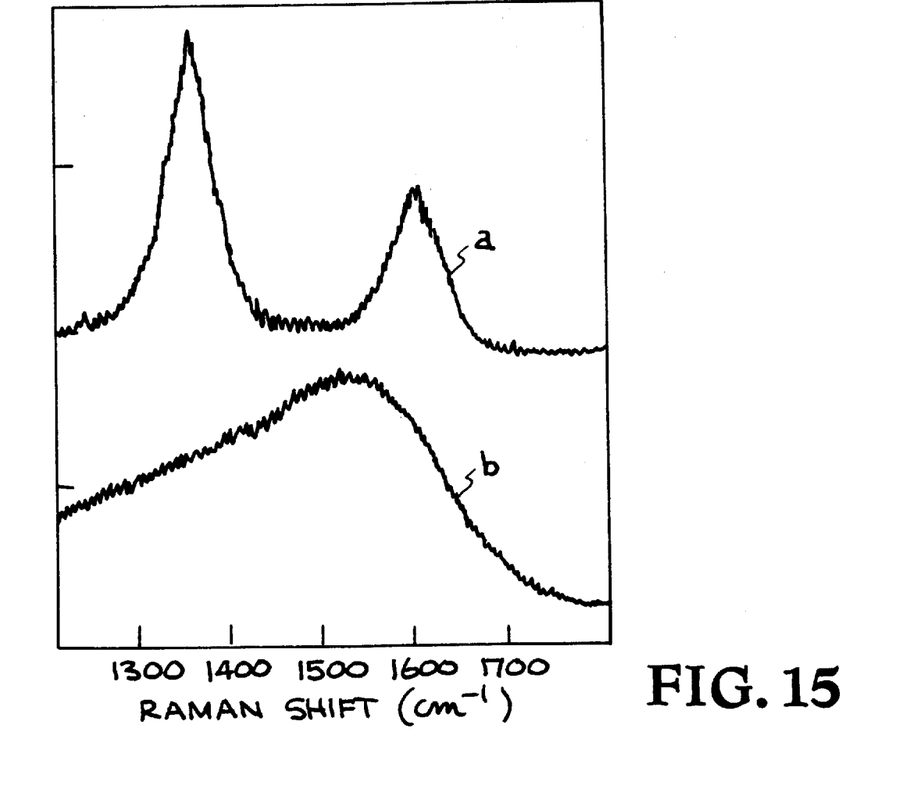
FIG. 15 shows Raman spectra for graphite (a) and amorphous "diamond-like" carbon (b).
Figure 16:
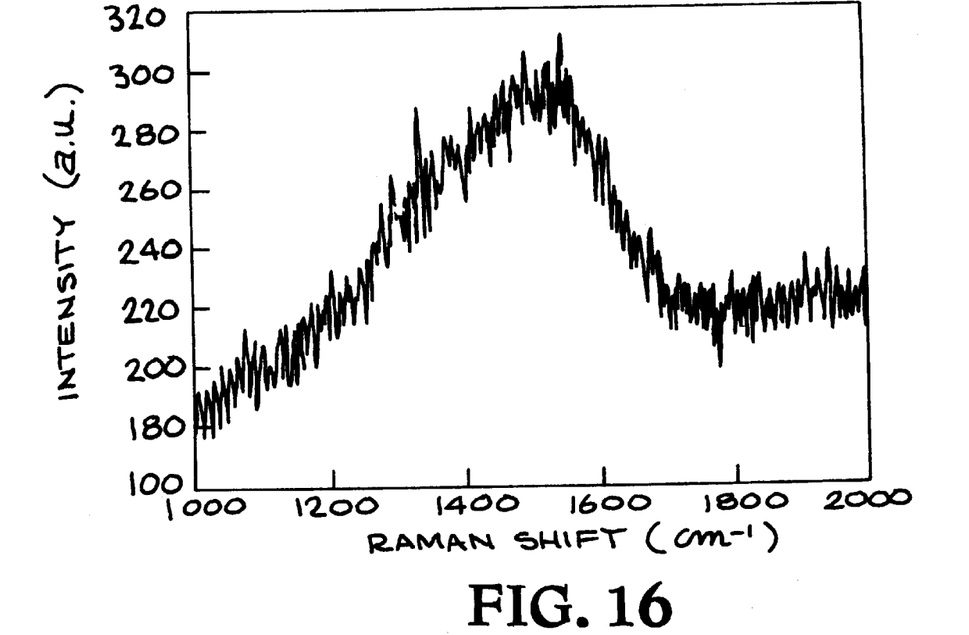
FIG. 16 shows a Raman Spectrum of a DLC film.

Raman spectroscopy is another common tool because the Raman from crystalline diamond and graphite are very distinct. Diamond has a very narrow, sharp peak near 1330 cm⁻¹ while graphite is characterized by two broad peaks centered near 1400 cm⁻¹ and 1600 cm⁻¹ (see FIG. 15). Amorphous carbon films, regardless of how they are produced, tend to have a structure shown in FIG. 15(b), a very broad peak centered near 1500 cm⁻¹. This latter form was observed in all films tested with no significant variation in the Raman signal from film to film. Each response was a broad peak (approximately 300 nm FWHM) centered at 1520 cm⁻¹ with one such spectrum shown in FIG. 16.

Figure 17:
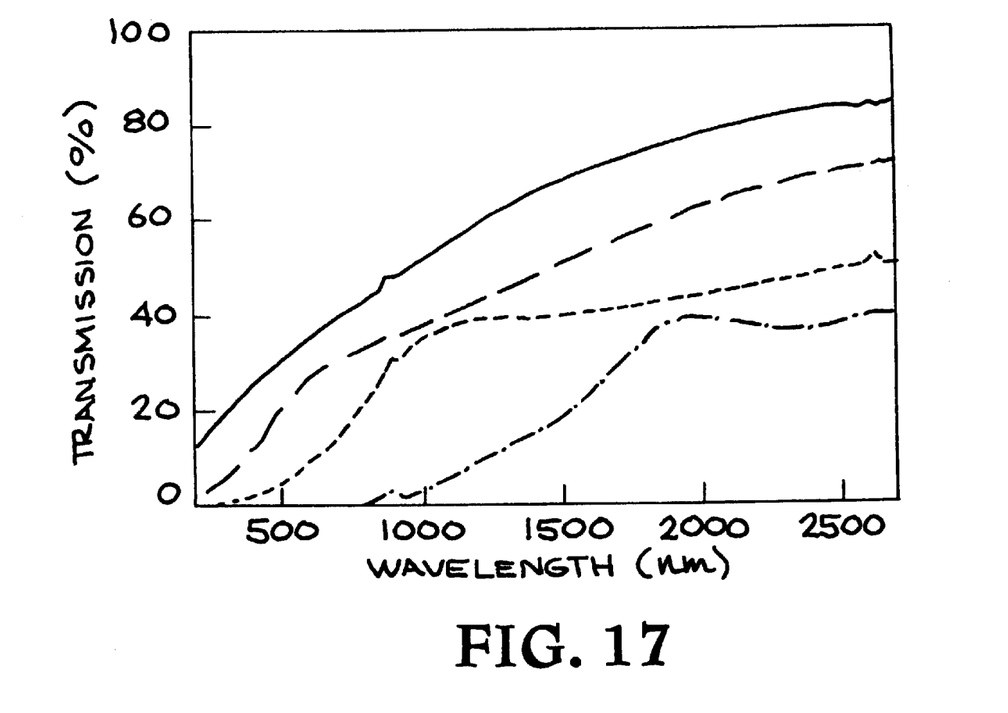
FIG. 17 shows transmission spectra of DLC films of four thicknesses: 45 nm (solid), 85 nm (dashed), 160 nm (dotted), and 600 nm (dash-dotted).

Optical transmission measurements were also made using a spectrophotometer on samples grown on fused quartz disks 1 mm in thickness. The films are quite opaque, particularly in the visible, although this is not uncommon for DLC films. They are appreciably more transparent above 2–2.5 µm. It was not possible to investigate transmission further into the infrared due to absorption features in the substrate around 3 µm. FIG. 17 shows the transmission spectra for four different films grown under the same conditions (1.4 J/cm²) with film thicknesses of 45 nm, 85 nm, 160 nm, and 610 nm. The modulation for thicker films is due to thin film interference effects, and the bump at 850 nm is an artifact of changing detectors at this point. These modulations can be very large because of the relatively high index of refraction for diamond and other forms of carbon. In fact, for the thinner films, the loss above 1.5 µm is due almost entirely to the film acting as a reflective coating. Even so, the loss coefficients are several thousand inverse centimeters, typical of PLD films.

Figure 18A:
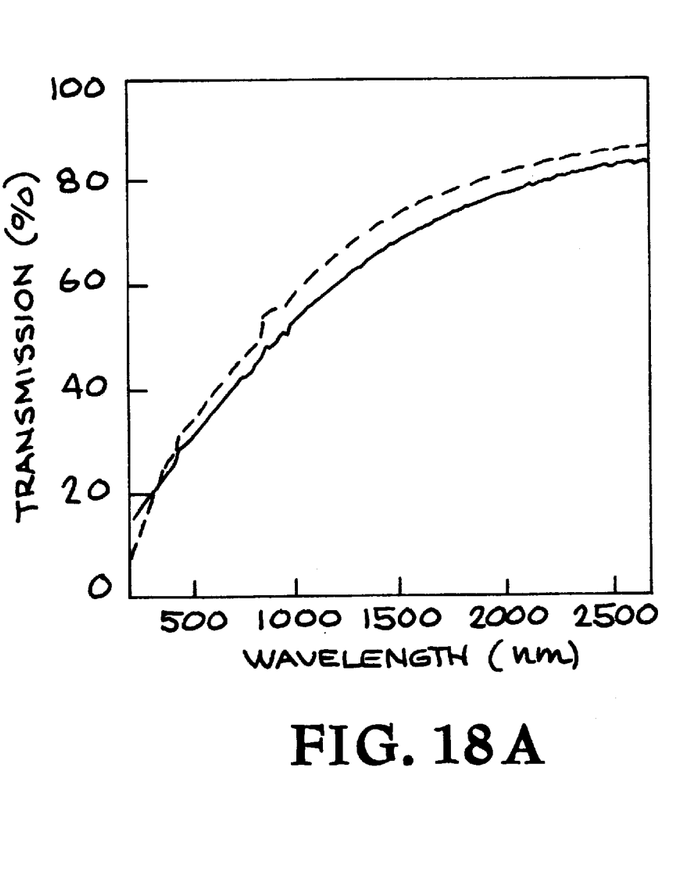
FIGS. 18A and 18B show the transmission spectra of DLC films.
Figure 18B:
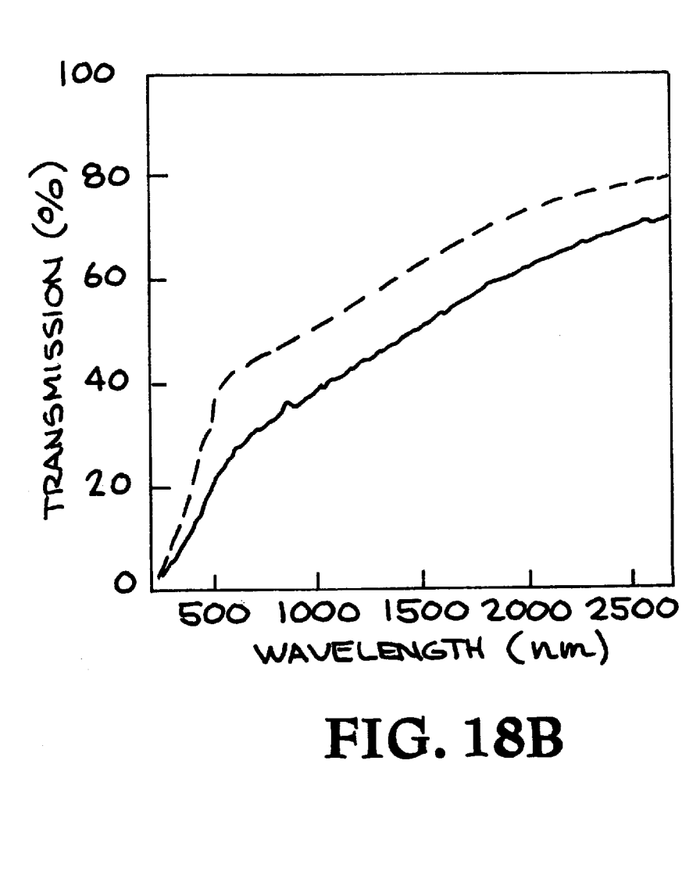

As mentioned previously, although EELS would indicate that fluences larger than 1.4 J/cm² result in films less diamond-like in character, FIGS. 18A and 18B show that higher fluences result in films which are substantially more transparent. FIG. 18(a) shows two 45 nm thick films grown at 1.4 J/cm² and 25 J/cm² with the latter being the upper curve. In FIG. 18(b), the two films are 85 nm thick with the upper curve being grown at 14 J/cm².

In an effort to determine the band gap of these films, spectral ellipsometry was used to fit the values of the real and imaginary part of the refractive index (n and k, respectively) as a function of wavelength. Using the values of k obtained, $(\alpha E)^{1/2}$ was plotted as a function of photon energy (E) which is known as a Tauc plot The x-intercept of this curve should provide an estimate of the band gap of the material. The value obtained is 0.8 eV which was insensitive to the model assumed in fitting n and k. This is also in the typical range for DLC films, 0.5–2 eV, with about 1 eV being most common.

Finally, Auger spectroscopy was performed on several of the films with only carbon and a small amount of oxygen being detected. The fine structure of the carbon signal had features which are typical again of amorphous DLC, and the oxygen signal was small and is likely due to subsequent surface contamination when the film is exposed to air. UV photoelectron spectroscopy was used to look at the band structure of the material, and a work function of 4.5 eV was measured.

Although it had been hoped to produce crystalline forms of diamond using femtosecond PLD, the present invention was able to produce amorphous films of diamond-like carbon with properties typical of PLD-produced DLC. However, deposition rates up to 26 µm/hr were achieved which are much higher than even many CVD methods. CPA femtosecond laser systems running at 10 kHz with average powers of 10–15 W are under development which would give deposition rates over 100 μm/hr. Films were produced which were free of the macroscopic particulates which are typical of PLD-produced films whose surface roughness, for films thinner than 300–500 nm, was primarily determined by that of the substrate. Finally, the unique features characteristic of femtosecond laser ablation is ideal for the precision machining of energetic materials.

The invention is not limited to the production of diamond-like carbon films. An advantage of using short pulse lasers is that the short pulses can be applied to making almost any type of film. Ultrashort pulse laser deposition is a very general technique that can be used with a very large range of target materials and target shapes.

The experimental parameters are given as an example, but are not intended to limit the scope of the invention. Parameters such as spot size, angle of incidence, laser fluence, bias voltage, laser pulse energy, laser wavelength, distance from target to substrate, etc., can vary from the disclosed embodiments. Although the film properties are typical of DLC films, it is possible that the variations in parameters will produce films with different properties. The process is not limited to a vacuum environment.

Changes and modifications in the specifically described embodiments can be carried out without departing from the scope of the invention, which is intended to be limited by the scope of the appended claims.

What is claimed is:

1. A thin film deposition apparatus, comprising:
   means for providing at least one laser pulse having a pulse duration of 100 picoseconds or less
   a source of deposition material within an evacuated chamber;
   means for directing said at least one laser pulse onto said source of deposition material to produce a plasma;
   a substrate;
   means for positioning said substrate to be in the path of said plasma, wherein said plasma is deposited on said substrate;
   means for delivering said at least one laser pulse as predominately S-polarized light onto said source of deposition material when a growth rate lower than that achieved when using predominately P-polarized or predominately circularly polarized light is desired; and
   means for delivering said at least one laser pulse as predominately P-polarized or predominately circularly polarized light onto said source of deposition material when a growth rate higher than that achieved when using predominately S-polarized light is desired.

2. The apparatus of claim 1, wherein said means for providing at least one laser pulse include means for providing a plurality of laser pulses.

3. The apparatus of claim 1, wherein said source of deposition material comprises graphite.

4. The apparatus of claim 3, wherein said source of deposition material comprises a graphite rod, wherein said apparatus further comprises means for rotating said graphite rod.

5. The apparatus of claim 1, wherein said substrate comprises a silicon wafer.

6. The apparatus of claim 5, wherein said silicon wafer comprises a single crystal silicon wafer.

7. The apparatus of claim 1, wherein said substrate comprises a quartz wafer.

8. The apparatus of claim 7, wherein said quartz wafer comprises a polished fused quartz wafer.

9. The apparatus of claim 1, further comprising means for electrically biasing said substrate.

10. The apparatus of claim 1, wherein said means for providing at least one laser pulse comprises include means for providing laser fluences incident upon said source of deposition material within a range of 0.1 J/cm$^2$ to 30 J/cm$^2$.

11. The apparatus of claim 1, wherein said source of deposition material is separated from said substrate by a distance of about 75 mm, wherein said at least one laser pulse comprises a spot size on said source of deposition material of about 250 μm in diameter.

12. The apparatus of claim 1, wherein said source of deposition material is separated from said substrate by a distance of about 75 mm, wherein said at least one laser pulse comprises a spot size on said source of deposition material of about 370 μm in diameter.

13. The apparatus of claim 1, wherein said source of deposition material is separated from said substrate by a distance of about 31 mm, wherein said at least one laser pulse comprises a spot size on said source of deposition material of about 630 μm in diameter.

14. The apparatus of claim 1, wherein said source of deposition material comprises a material removal region that is determined by the spot size of said at least one laser pulse upon said source of deposition material, wherein said thin film grows linearly with respect to the area of said material removal region for a given fluence.

15. The apparatus of claim 1, wherein said plasma comprises no macroparticulates.

16. The apparatus of claim 1, wherein said plasma comprises no macroparticulates and no buffer gases are required to reduce the impact of said macroparticles.

17. The apparatus of claim 9, wherein said substrate is electrically biased to −300 V.

* * * * *